(12) United States Patent
Abe et al.

(10) Patent No.: US 6,650,878 B1
(45) Date of Patent: Nov. 18, 2003

(54) AUTOMATIC GAIN CONTROL CIRCUIT AND RECEIVER HAVING THE SAME

(75) Inventors: Shuji Abe, Tokyo (JP); Katsuya Kudo, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 524 days.

(21) Appl. No.: 09/672,980

(22) Filed: Sep. 29, 2000

(30) Foreign Application Priority Data

Sep. 29, 1999 (JP) .......................................... P11-277200

(51) Int. Cl.[7] ................................................ H04B 1/06
(52) U.S. Cl. ................................ 455/232.1; 455/245.1; 455/234.1; 455/234.2
(58) Field of Search .......................... 455/245.1, 234.1, 455/234.2, 232.1, 247.1, 239.1, 241.1; 330/129, 280

(56) References Cited

U.S. PATENT DOCUMENTS 3,740,471 A * 6/1973 Wilcox ........................ 330/280
5,745,847 A * 4/1998 Matsuo ..................... 455/234.1
5,884,153 A   3/1999 Okada
6,070,062 A * 5/2000 Yoshida et al. .......... 455/234.1
6,107,878 A * 8/2000 Black ......................... 330/129
6,498,926 B1 * 12/2002 Ciccarelli et al. ........ 455/245.1

FOREIGN PATENT DOCUMENTS

JP          9-181632          7/1997

* cited by examiner

Primary Examiner—Quochien Vuong
Assistant Examiner—Lana Le
(74) Attorney, Agent, or Firm—Pillsbury Winthrop LLP

(57) ABSTRACT

An automatic gain controller and a receiver having the automatic gain controller, which obtains a stable fine reception quality without influences of the receiving channel or the receiving radio wave is provided. It is provided with the reception quality detector 20 for detecting the reception quality of the diffusion of the constellation, the error correction ratio or the error rate, so as to setup the optimal standard revel (TOP) by switching the reference level (TOP) for switching the IF_AGC operation and the RF_AGC operation according to the reception quality. As a result, it determines the degradation of the reception quality caused by the non-linear distortion or the insufficiency of the C/N according to the radio frequency efficiency that differs from each channel or the receiving radio wave such as a level of the adjacent channel, so as to setup the optimal receiving condition.

12 Claims, 8 Drawing Sheets

AUTOMATIC GAIN CONTROL CIRCUIT AND RECEIVER HAVING THE SAME

FIELD OF THE INVENTION

The present invention relates to a receiver having an automatic gain controller, and more particularly, to an automatic gain controller for use in primarily receiving digital modulation signals (e.g. OFDM signals, 8VSB signals, 64QAM signals, QPSK signals) transmitted in a terrestrial broadcast, a CATV broadcast, a satellite broadcast, etc.

BACKGROUND OF THE INVENTION

Recently, a digital broadcast by the satellite wave, terrestrial or cable has been performed.

A receiver for demodulating digital modulation broadcast signals is constructed to supply a received radio frequency signal (hereinafter, referred to as RF signal) to a mixer via a first variable gain circuit. In the mixer the RF signal and a local oscillation signal generated at a local oscillator are mixed together, and thus an intermediate frequency signal (hereinafter, referred to as IF signal) is output therefrom.

The IF signal output from the mixer is amplified in an IF-amplifier and then supplied an A/D converter via a second variable gain circuit. Thus the IF signal is converted to a digital IF signal at the A/D converter and after that the digital IF signal is demodulated at a digital demodulator.

In general, the first variable gain circuit is referred to as an RF AGC circuit, while the second variable gain circuit is referred to as an IF AGC circuit. These AGC circuits are constructed to be controlled their gains in response to the levels of the digital IF signal. Thus, the IF signal passing through the AGC circuits is adjusted to have an optimal level.

The RF signal which is input through the input terminal has normally a power in a range from about 90 dB (mW) to 10 dB (mW) per 1 channel. Since the first variable gain circuit, the mixer and the IF amplifier have the non-linear region in such an input level range, when the greater signal is input to the adjacent channel it causes the non-linear distortion. These non-linear distortions degrade the reception quality of the desired channel. So that these have to be reduced in the first variable gain circuits which are placed in relatively near to the input terminal.

On the other hand, when a relatively low level RF input signal is gain-controlled at only the first variable gain controllers that are close to the input terminal, the non-linear distortion can be improved better. However, it cannot keep a required C/N ratio, So that the reception quality is degraded. So, the lower input level signals have to be gain-controlled in the second variable gain control circuit which is remote from the input terminal, so as to keep the required C/N ratio.

Accordingly, when the RF input level to the receiver is lower than a take-over point (hereinafter, referred to as "TOP") representing a reference level it activates the second variable gain circuit, and when the RF input level to the receiver is higher than the reference level it activates the first variable gain circuits. So, it is important to set the reference level optimal for decrease the non-linear distortion as keeping the required C/N ratio, and maintain the fine reception quality.

Here, Japanese paten application JP9-181832 which was laid-open on Jul. 11, 1997 discloses a tuner circuit comprising an RF AGC circuit and an IF AGC circuit which is capable of controlling AGC voltages to be applied to an RF amplifier and an IF amplifiers in response to levels of input RF signal.

However, conventionally in a representative receiving channel, the TOP value is setup that is receivable enough under the worst condition that there is an interference signal in the adjacent channel.

However, according to the conventional technique, since there are differences of efficiency in the non-linear distortion, the gain, and the noise index in the radio frequency circuit between the representative channel setup the TOP value and other channels, it is difficult to obtain the optimal reception quality in all receiving channel.

Further, there is another drawback that since the TOP value is setup under the worst condition that there is interference such as an adjacent-channel interference, it degrades the C/N ratio excessively when the interference level is lower or there is no interference.

As mentioned above, there is a drawback those since the TOP value is setup in the representative channel the relation between the degradation and the C/N ratio differs from the preferable value. Further, when the interference level is low it degrades the C/N excessively.

SUMMARY OF THE INVENTION

So, the present invention has been made in view of the problems shown above and it is the object of the present invention to provide an automatic gain controller and a receiver having the automatic gain controller which obtain the stable and fine reception quality without being affected by the receiving channel or receiving electric wave.

A first aspect of the automatic gain controller for use in a receiver for demodulating a radio frequency signal includes a circuit located on a passage of the radio frequency signal, which having a non-linear region to an input level of the radio frequency signal which is supplied as an input, a first variable gain circuit which is placed ahead the circuit with the non-linear region, a second variable gain circuit which is put after the circuit with the non-linear region, a gain controller, which is for controlling the gains of the first and the second variable gain circuits according to the signal level output from the second variable gain control, for controlling to activate the gain control of the second variable gain circuit when the input level of the radio frequency signal to the receiver is lower than a reference level, and controlling to activate the gain control of the first variable gain circuit and also controlling to maintain the gain of the second variable gain circuit to the certain level when the input level is over the reference level, a reception quality detector for detecting the reception quality which is defined after the second variable gain circuit, and a reference level setting unit for setting up the reference level, which is variable according to the reception quality detected in the reception quality detector, in the gain controller.

Further to the automatic gain controller as defined in the first aspect of the invention, in a second aspect of the automatic gain controller the reception quality of signals is detected first by a reference level pre-designated in the reference level setting unit, and again detected by another reference level which is varied from the pre-designated reference level in the direction that the reception quality is improved.

Further to the automatic gain controller as defined in the first or second aspect of the invention, in a third aspect of the automatic gain controller the reception quality detector detects the reception quality of signals by using a spread constellation.

Further to the automatic gain controller as defined in the first or second aspect of the invention, a fourth aspect of the automatic gain controller the reception quality detector detects the reception quality of signals by using an error correction ratio.

Further to the automatic gain controller as defined in the first or second aspect of the invention, a fourth aspect of the automatic gain controller the reception quality detector detects the reception quality of signals by using an error correction ratio.

Further to the automatic gain controller as defined in the first or second aspect of the invention, in a fifth aspect of the automatic gain controller the reception quality detector detects the reception quality by using an error ratio of signals before or after the error correction of the signals.

Further to the automatic gain controller as defined in any one of the first to fifth aspects of the invention, a sixth aspect of the automatic gain controller includes a memory for storing the values of the reference level, and wherein a reference level which is varied to optimally increase the reception quality of signals and thus capable to be used as an initial value of the reference signal in a following reception of signals.

An aspect of a receiver for demodulating a radio frequency according to the present invention signal includes an input terminal for receiving a radio frequency signal, a frequency converter for converting the radio frequency signal received at the input terminal into an intermediate frequency signal, a first variable gain circuit followed by the frequency converter, a second variable gain circuit placed in following the frequency converter, a gain controller, which is for controlling the gains of the first and the second variable gain circuits according to the signal level output from the second variable gain control, for controlling to activate the gain control of the second variable gain circuit when the input level of the radio frequency signal to the receiver is lower than a reference level, and controlling to activate the gain control of the first variable gain circuit and also controlling to maintain the gain of the second variable gain circuit to the certain level when the input level is over the reference level, a reception quality detector for detecting the reception quality which is defined after the second variable gain circuit, and a reference level setting unit for setting up the reference level, which is variable according to the reception quality detected in the reception quality detector, in the gain controller.

According to the present invention, it has a detector for detecting the reception quality, and a reference level (i.e., TOP) value for switching the operation between the second variable gain circuit (IF_AGC) and the first variable gain circuits (RF_AGC) is varied so as to obtain an optimal reference level. As a result, according to condition of the radio frequency which differs from each receiving channel, or the level relationship between adjacent channel signals, it determines the degradation of the reception quality caused by the non-linear distortion or the C/N ratio insufficiency so as to obtain an optimal receiving condition. The reception quality detector can use a spread constellation, an error correction ratio, or an error rate.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Some embodiments of the present invention will be explained hereinafter in reference to the accompanying drawings.

Figure 1:
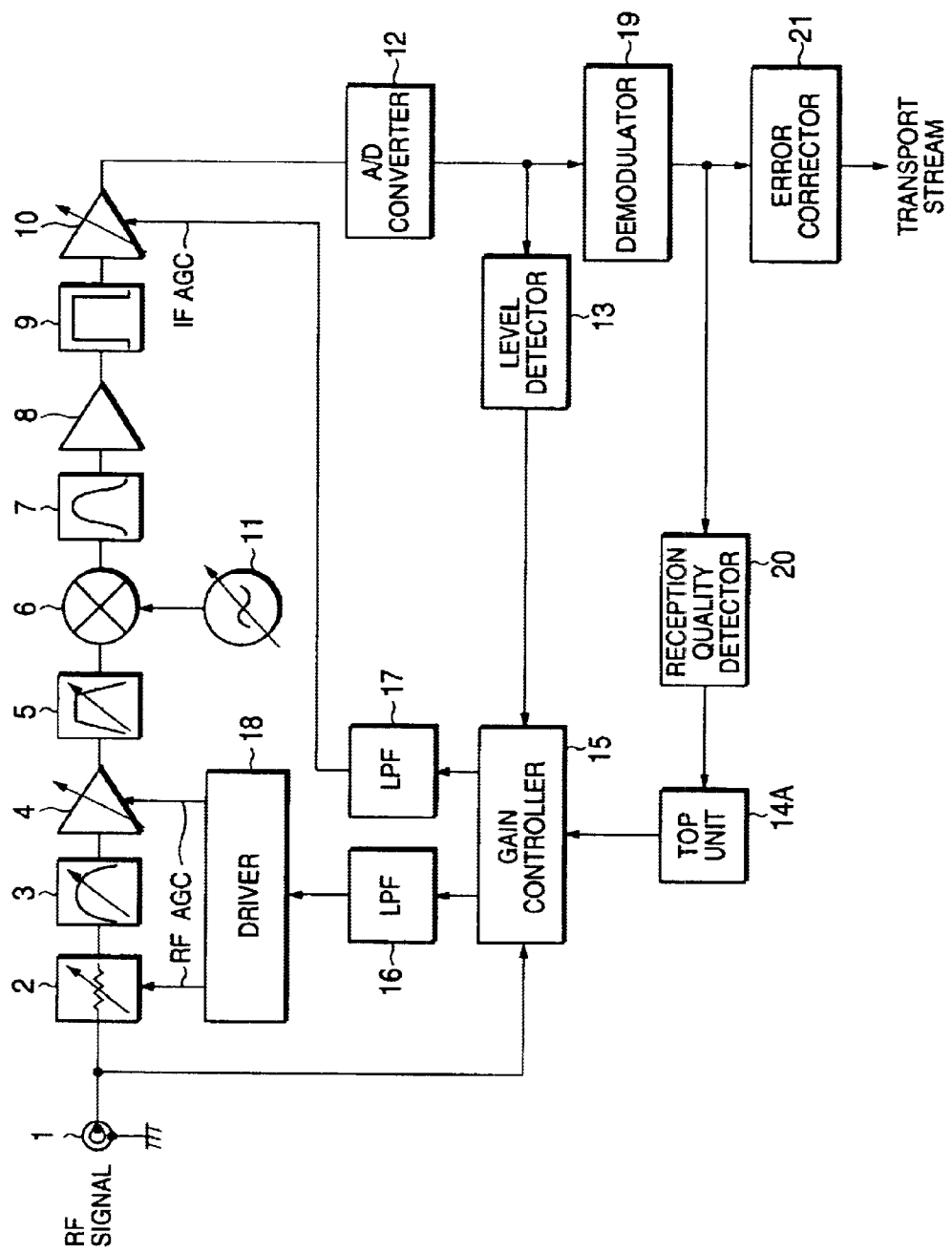
FIG. 1 is a block diagram showing a receiver having an embodiment of the automatic gain controller according to the present invention.

FIG. 1 is a block diagram showing a receiver equipped with an embodiment of the automatic gain controller according to the present invention.

In FIG. 1, a digital modulation RF signal is input through the input terminal 1. Then the input signal is input to the mixer 6 via the first variable gain circuits 2, 4, and the BPFs (band pass filter) 3, 5.

The set of first variable gain circuits 2 and 4 contains, for example, an attenuator type variable gain circuit 2 using PIN diodes and an amplifier type variable gain circuit 4 using dual-gates FET. The driver 18 is used when the necessary current is not passed or when the control voltage range is adjusted.

When the first variable gain circuit 4 is constructed by the variable gain amplifier using dual-gate FETs, the circuit 4 operates as a variable gain circuit and a circuit having a non-linear region. The first variable gain circuit 2 is placed ahead the circuit with the non-linear region.

In the mixer 6, the modulated RF signal and the local oscillation signal generated at the local oscillator 11 are mixed together, and thus an IF signal is output.

The IF signal output from the mixer 6 is input to the A/D converter 12 via the BPFs 7 and 9, the IF amplifier 8, and the second variable gain circuit 10.

The IF signal is input to the A/D converter 12, and wherein it is converted into the digital signal, then the level detector 13 detects the level difference of the digital signal from a pre-designated optimal input level of the A/D converter 12.

The level detector 13 is comprised of the error detecting portion for detecting the difference between the optimal input digital value and the digital value from the A/D converter 12, and a PWM circuit for converting the difference value into the pulse amplitude modulating signal (PWM).

The TOP unit 14A, the gain controller 15, the LPF 16 and 17, and the driver 18 control the first variable gain circuits 2, 4 and the second variable circuit 10 so as to control the input level of the A/D converter 12 to be the optimal value.

The power of the RF signal which is input through the input terminal 1 in normally about 90 dB (mW) to 10 dB (mW) per 1 channel. Since the first variable gain circuit 4, the mixer 6 and the IF amplifier 8 have the non-linear region in such an input level range, when the greater signal is input to the adjacent channel it causes the non-linear distortion.

As described above, these non-linear distortions degrade the reception quality of the desired channel. So that these have to be reduced in the first variable gain circuits 2 and 4 which are relatively close to the input terminal 1.

On the other hand, when a relatively low level RF input signal is gain-controlled at only the first variable gain controllers 2 and 4 that are close to the input terminal 1, it cannot keep a required C/N ratio, so that the reception quality is degraded. So, the lower input level signals have to be gain-controlled in the second variable gain control circuit 10 which is remote from the input terminal 1

Accordingly, when the RF input level to the receiver is lower than TOP (standard input level) it activates the second variable gain circuit 10, and when the RF input level to the receiver is higher than the reference level it activates the first variable gain circuits 2 and 4. So, it is important to obtain the TOP optimal for maintaining the fine reception quality.

The receiver of FIG. 1 differs from the receiver, as shown in FIG. 9 by that it has a reception quality detector 20 for detecting the reception quality based on outputs from the demodulator 19. According to the detected reception quality the values of the reference level of the TOP unit 14A is varied so as to obtain the optimal reference level for the reception quality.

In an automatic gain controller in a receiver of FIG. 1, the variable gain circuit 2 is defined before the circuit with the non-linear region between the circuit 4 to the IF amplifier 8, and the second variable gain circuit 10 is defined after the circuit. The IF output of the second variable gain circuit is performed the digital conversion in the A/D converter 12, and the level of the digital converted signal is detected in the level detector 13 (the difference signal lo the optimal input level in the A/D converter 12 is PWM output), then the signal is smoothed via the gain controller 15 and the LPF 16 or 17. Then the signal is feed back to the variable gain circuit 10 of the variable gain circuit 3, 4 or IF_AGC as the AGC voltage, so as to maintain the receiving qualify.

At that time, the RF input level is compared to the TOP (reference level) from the TOP unit 14A in the gain controller 15. When the RF input level is lower than the TOP the IF_AGC is controlled by supplying the difference PWM oOutput from the level detector 13 to the control terminal of the second variable gain circuit 10 via the LPF 17. When the RF input level is higher the RF_AGC is controlled by supplying the difference PWM output from the level detector 13 to each control terminal of the variable gain circuits 2, 4 via the LPF 16 and the driver 18.

In the above embodiment the TOP is desirably setup by switching the TOP setup value of the TOP unit 14A according to the reception quality detected in the reception quality detector 20. That is, the TOP in the TOP unit 14A is setup according to the reception quality detected in the reception quality detector 20.

Here, it uses a reverse AGC, that the more the AGC voltage increases the more the circuit gain increases.

Next, the operation, as shown in FIG. 1 is explained in reference to FIGS. 2 to 4.

Figure 2A:
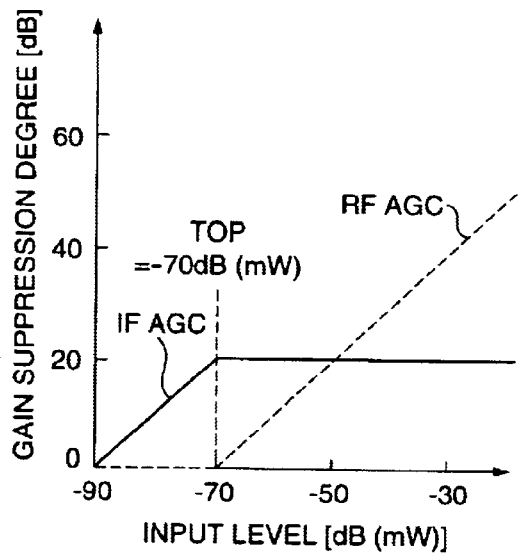
FIGS. 2A to 2C are graphs showing the relation between the RF input level and the gain suppression degree for explaining the operation of varying the TOP.
Figure 2B:
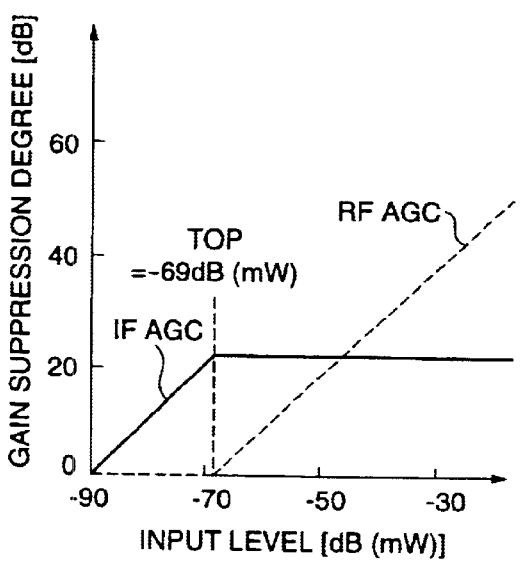
Figure 2C:
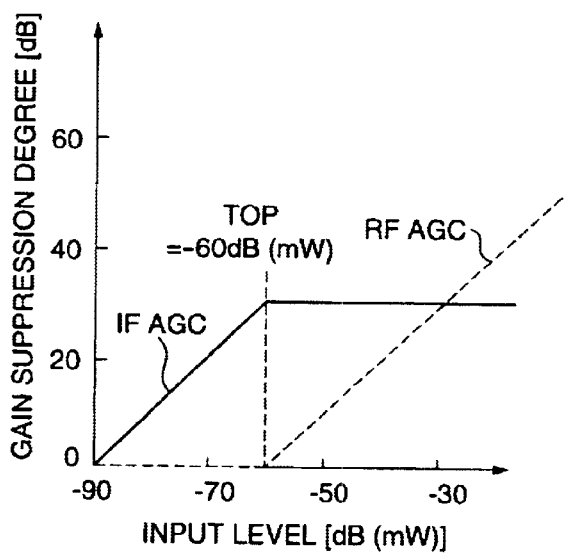

FIGS. 2a to 2C show graphs for explaining the TOP setup The horizontal axis represents the RF input level, while the vertical axis represents the gain suppression degree. The broken line represents the gain suppression degree (dB) of the first variable gain circuits 2, 4 for performing RF_AGC, while the solid line represents the gain suppression degree (dB) of the second variable gain circuit 10 for performing IF_AGC.

FIG. 2A shows that the TOP is pre-designated to −70 dB (mW) in TOP unit 14A. When the RF input level is lower than TOP the first variable gain circuits 2, 4 operate at the maximum gain (gain suppression degree of 0 dB). And the second variable gain circuit 10 suppresses the gain in a ratio 1:1 to the RF input level increase, so as to maintain the input level to the A/D converter 12 constant. When the RF input level is higher than the TOP, the gain suppression degree of the second variable gain circuit 10 maintains the state of TOP (shown by 20 dB, in FIG. 2A). And the first variable gain circuits 2, 4 suppresses the gain in a proportion at 1:1 to the RF input level increase, so as to maintain the input level to the A/D converter 12 constant. In the TOP state (−70 dB), the reception quality detector 20 detects the reception quality once.

Next, as shown in FIG. 2B, the TOP unit 14A setups the TOP in −69 dB (mW). In this case, without switching the TOP, the same level controls as those, as shown in FIG. 2A are performed. In that state of TOP (−69 dB), the reception quality detector 20 detects the reception quality again.

To the reception quality when the TOP is −70 dB (mW), if the detecting result of the reception quality when the TOP is −69 dB (mW) is improved, the reception quality is detected by switching the TOP to −68 dB (mW). However, to the reception quality when the TOP is −70 dB (mW), if the reception quality gets worse when the TOP is −69 dB (mW), the reception quality is detected by switching the TOP to −71 dB (mW). Accordingly the TOP unit 14A setups the optimal TOP.

As shown in FIGS. 2A and 2B, TOP is increased by 1 dB. However, in case of decreasing the TOP the precision could be improved by switching in detail steps, or the time could be shorten by switching in rough steps. Further, the TOP could be varied among two or more of pre-designated relatively narrow choice of options.

Figure 3B:
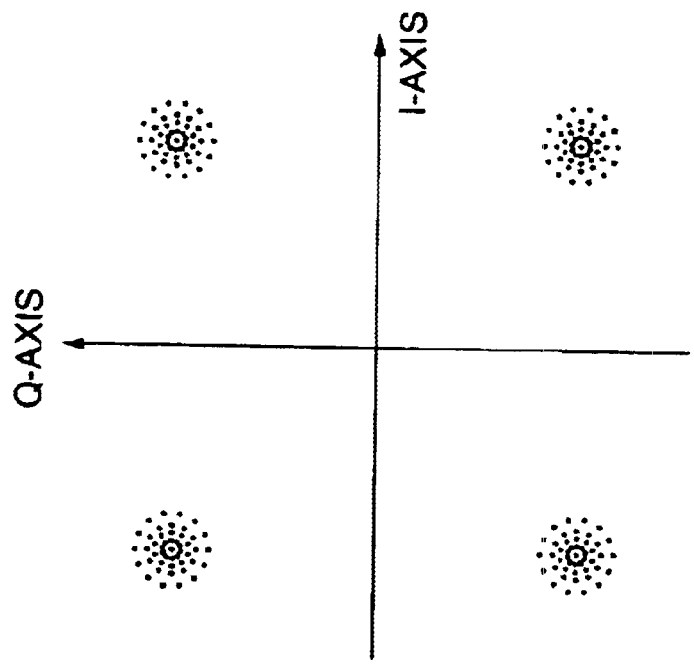
FIG. 3 is a drawing showing a spread I-Q constellation for explaining one embodiment of the reception quality detector.
Figure 3A:
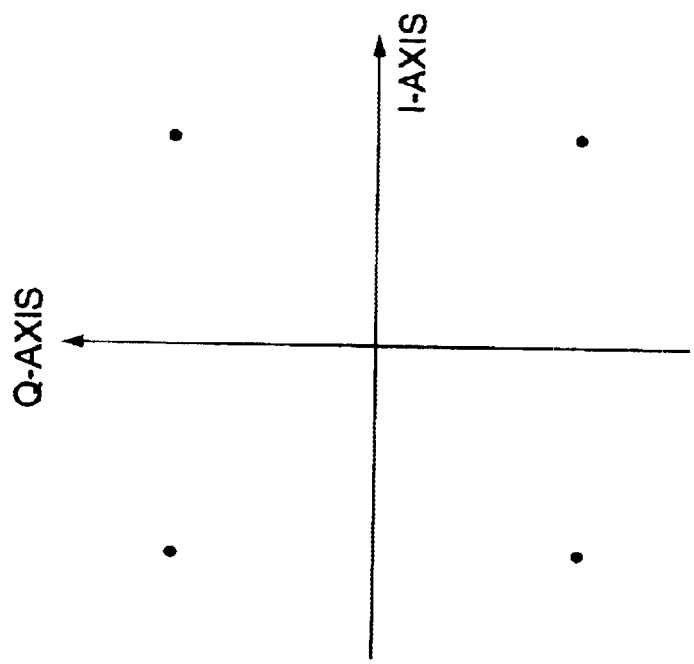

FIGS. 3A and 3B are drawings for explaining the operation of the reception quality detector 20. Here, the reception quality detector 20 has a function for detecting the spread I-Q constellation after digital demodulation.

FIG. 3A shows the ideal constellation in QPSK, while FIG. 3B shows the constellation when the reception quality is degraded.

As shown in FIG. 3B, when the non-linear distortion has a bad influence to the reception quality, or when the insufficiency of the C/N ratio also has a bad influence, the constellation points spreads around the ideal points in a prescribed period, as shown in FIG. 3A. The spreading of these constellation points are statistically processed in the reception quality detector 20, so as to determine a superiority or an inferiority of the reception quality.

Next, the construction and the operation of the gain controller 15, as shown in FIG. 1, will be explained in reference to FIGS. 4A and 4B.

Figure 4A:
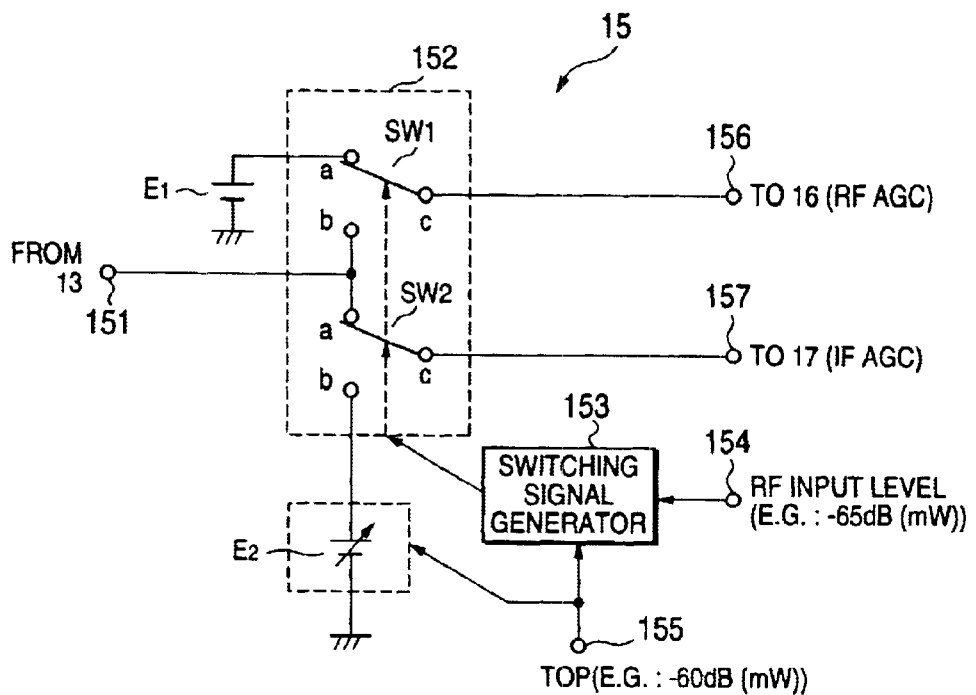
FIG. 4 is a drawing for explaining an exemplified construction and operation of the gain controller, as shown in FIG. 1.
Figure 4B:
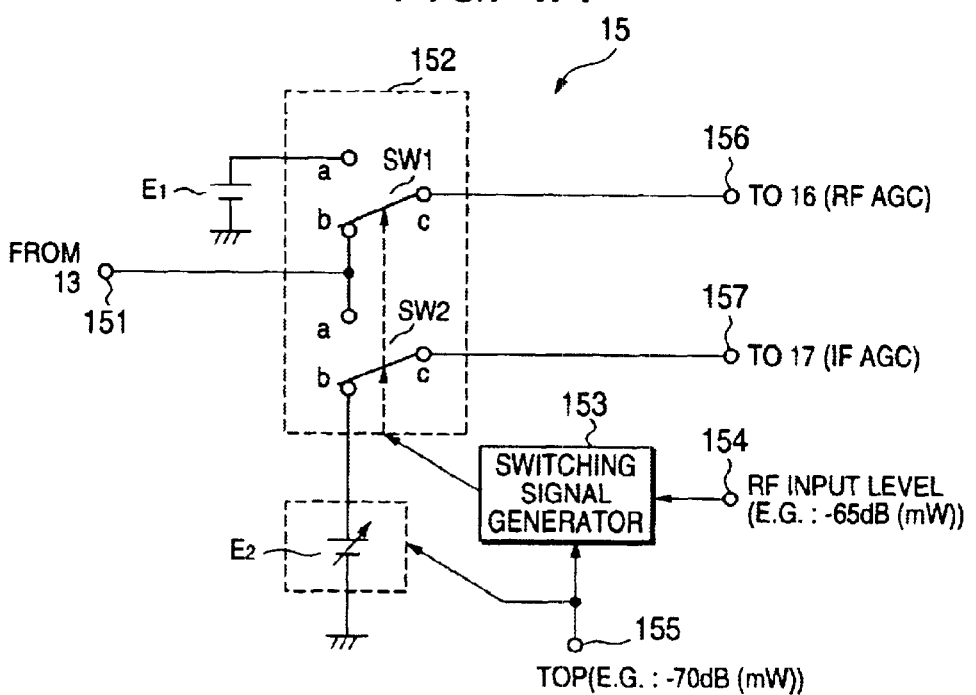

As shown in FIGS. 4A and 4B, the PWM error signal from the optimal input level of the A/D converter 12 is input to an input terminal 151 from the level detector 13. The PWM signal is supplied to a switch unit 152. The switch unit 152 is comprised of two switches SW1 and SW2 which operate together by the switching signal. These switches SW1 and SW2 has two input terminal a and b and one output terminal c, respectively The output terminal c is electrically connected to any one of the input terminals a and b by a switching signal. To the input terminal a of the switch SW1 a DC voltage source E1 is connected, which applies the RF_AGC voltage when the variable gain circuits 2, 4 become the maximum gain (the gain suppression degree 0 dB in FIG. 2). The other input terminal b of the switch Sw1 and the one input terminal a of the switch SW2 are connected, and to the connection the PWM signal which is corresponding to the level difference is supplied from the input terminal 151. To the other input terminal b of the switch SW2 the direct voltage supply E2 is connected, which applies the IF_AGC voltage in TOP (standard level The direct current supply E2 is comprised of the variable direct current supply, which changes the voltage according to the TOP, supplied to an input terminal 154. A switching signal generator 158 inputs the RF input level based on the RF signal out of the input terminal 1 to the input terminal 154, and inputs the TOP output from the TOP unit 14A to another input terminal 155. And it compares the RF input level and the TOP. When the RF input level is lower than the TOP, as shown in FIG. 4A, it generates the switching signal for switching the switches SW1 and SW2 to the input terminal a at the same time. When the RP input level is higher than the TOP, as shown in FIG. 4B, it generates the switching signal for switching the switches SW1 and SW2 to the input terminal b at the same time.

In the construction, as shown in FIGS. 4A and 4B, the level of the RF input signal is −65 dB (mW) for instance, when the optimal TOP setup value is −69 dB (mW) which is set based on the detected reception quality, the relation between the RF input level and the RF_AGC and IF_AGC gain suppression degree will be as one, as shown in FIG. 2C. Since the RF input level is lower than the TOP, the output terminals c of the switches SW1 and SW2 are switched to the input terminal a by the switching signal generator 153, as shown in FIG. 4A. As a result, the first variable gain circuits 2, 4 input the voltage as the RF_AGC voltage for applying the maximum gain from the DC voltage source E1 via the LPF 16. And the second variable gain circuit 10 inputs the PWM signal from the level detecting part 13 as the IF_AGC voltage via the LPF17 so as to activate the gain control.

Furthermore, for instance the level of the RF input signal is −65 dB (mW) and the optimal TOP setup value setup based on the detected reception quality becomes −70 dB (mW), the relation of the gain suppression degree of the RP_AGC signal and the IF_AGC signal to the RF input level will be the value, as shown in FIG. 2A. Since the RF input level is higher than the TOP the switches SW1 and SW2 in the switch unit 152 are changed to the input terminal b by the switching signal from the switching signal generator 153, as shown in FIG. 4B. As a result, the second variable gain circuit 10 inputs the voltage for applying the gain suppression degree (20 dB in the drawing) in the TOP setup value (−70 dB (mW)) from the variable direct current voltage supply E2 via the LPP17 as the IF_AGC voltage.

The first variable gain circuits 2, 4 perform the RF_AGC gain control operation by inputting the PWM signal from the level detector 13 as the RF_AGC voltage via the LPF16.

Instead of constructing the PWM circuit in the level detector 13, the PWM circuit may be constructed in the gain controller 15. The PWM circuit is used because it adjusts well with the digital circuit in the level detector 13. As the function of the first LPF16 and the second LPF17, ripples of the PWM pulse may be suppressed. So, by setting up the period of the PWM pulse short the time constant of the LPFs 16 and 17 can be setup small, so as to make it possible to control fast according to the necessity.

By the way, as the method for performing the gain control, as shown in FIGS. 2A and 2B, the first variable gain circuits 2, 4 (e.g., RF_AGC units) and the second variable gain circuit 10 (e.g., IF_AGC unit) are selectively controlled in the logical circuit construction as explained in reference to FIGS. 4A and 4B. However, an analog gain controller may be used which uses the comparator in the gain controller 15, as shown in FIG. 5.

Figure 5:
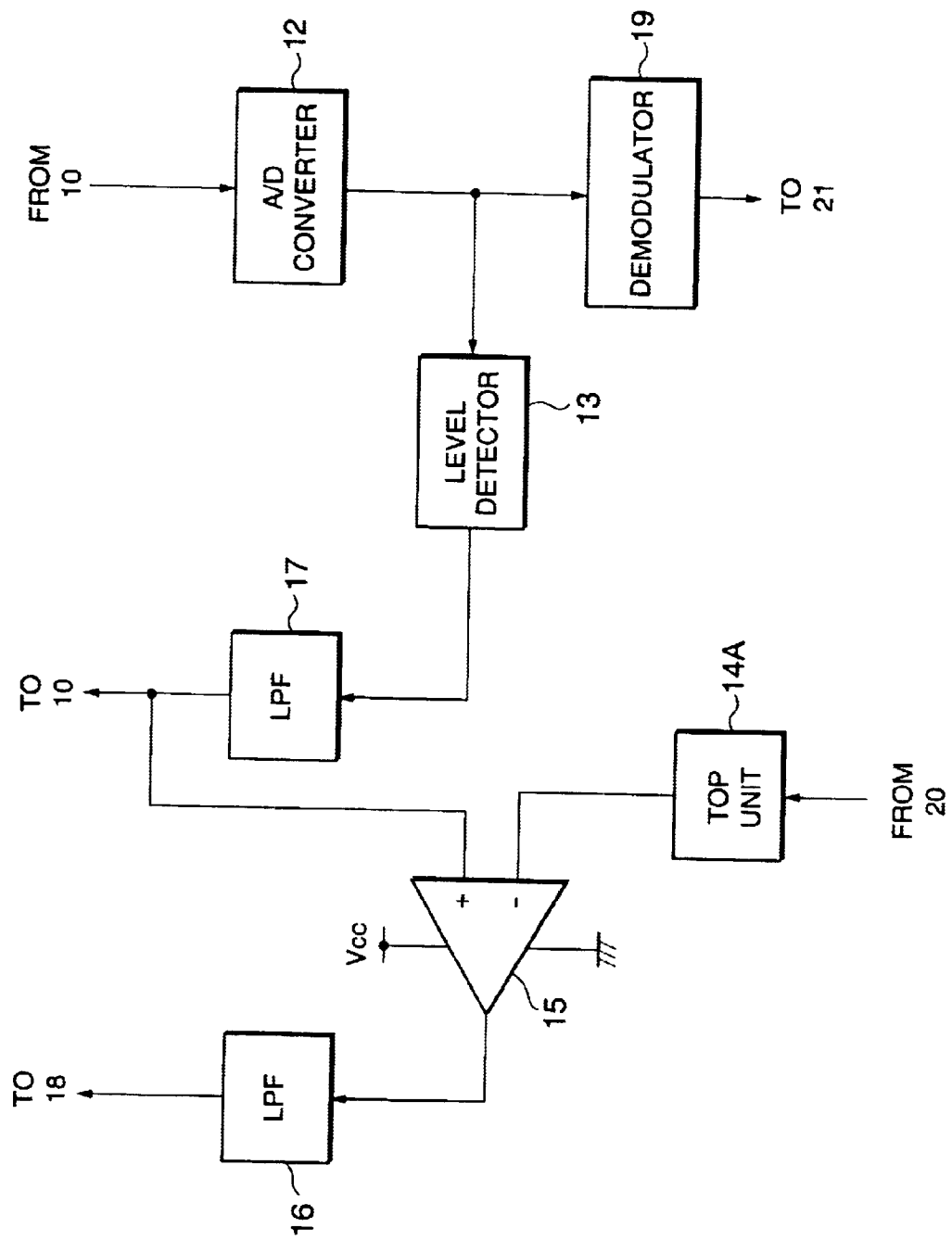
FIG. 5 is a block diagram showing another exemplified construction of the gain controller, as shown in FIG. 1, e.g., an analog gain controller using a comparator as a gain controller.

FIG. 5 shows the other embodiment of the gain controller 15 A comparator is used as the gain controller 15, as shown in FIG. 1. At that time, the time constant of the LPF 16 is setup great according to the time constant of the LPF 17. The output voltage of the LPF17 is able to quickly follow the output switching of the level detector 13. And the output voltage of the LPF16 is able to quickly follow the output switching of the level detector 13.

Hereinafter the operation, as shown in FIG. 5, will be explained. The control voltage (PWM signal) obtained from the level detector 13 is smoothed in the LPF 17 and it controls the second variable gain circuit 10. The voltage smoothed in the LPF 17 is input to the one input terminal of the comparator 15. The TOP (standard voltage) setup in the TOP unit 14A is input to the other input terminal of the comparator 15. As described above, the level detector 13 detects the difference of the output level of the A/D converter 12 from the optimal input level of the A/D converter 12, and outputs the control voltage according to the difference (PWM signal).

In the case that the RF input level is lower than the TOP level and the control voltage (the error voltage to the optimal input level) from the level detector 13 becomes great, and the output voltage from the LPF 17 is higher than the standard voltage setup in the TOP unit 14A, the comparator 15 outputs the high level voltage (that is, the maximum voltage of the comparator 15). So that the LPF 16 supplies the maximum value of the AGC voltage to the first variable gain circuits 2, 4. As a result, in the period that the output of the comparator 15 is high level the output of the LPF 17 is used as the IF_AGC voltage with maintaining the gain of the first variable gain circuits 2,4 constant, so that the IF_AGC operation is carried out in order to maintain the input level of the A/D converter 12 in the second variable gain circuit 10.

However, in the case that the RF input level is higher than the TOP level and the control voltage (the error voltage to the optimal input level) from the level detector 13 becomes low, and the output voltage from the LPF 17 is lower than the standard voltage setup in the TOP unit 14A, the comparator 15 outputs the low level voltage (that is, the potential of the standard potential point). So that by setting the time constant of the LPF 16 to be 1000 times to 10000 times of the time constant of the LPF 17, the output of the LPF 16 (RF_AGC voltage) is decreased slowly. Accordingly the gain of the first variable gain circuits 2, 4 is decreased slowly from the maximum gain (that is, the gain suppression degree is increased slowly). As a result, in the period that the output of the comparator 15 is low level the output of the LPF 16 is used as the RF_AGC voltage with maintaining the gain of the second variable gain circuit 10 constant, so that the RF_AGC operation is carried out in order to maintain the input level of the A/D converter 12 in the first variable gain circuits 2, 4. In such an analog gain controller, it is possible to perform the control as explained in reference to FIGS. 2A and 2B.

Figure 6:
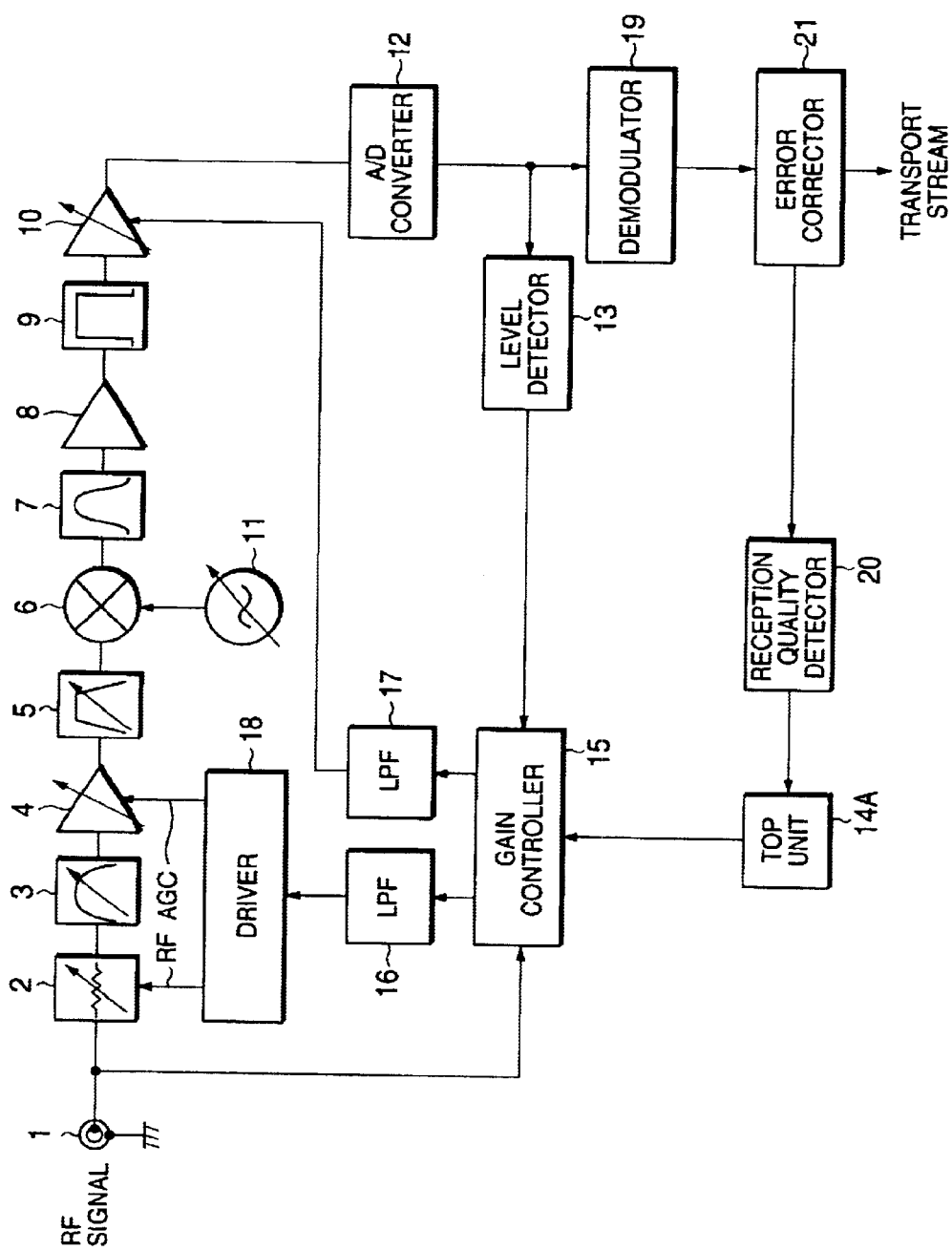
FIG. 6 is a block diagram showing a receiver having still another embodiment of the automatic gain controller according to the present invention.

FIG. 6 in a block diagram showing the other embodiment of the receiver having the automatic gain controller according to the present invention.

A difference of FIG. 6 from FIG. 1 is that the reception quality detector 20 detects the reception quality by using the error rate before correcting the error, the error correction ratio, or the error rate after correcting the error in the error corrector 21.

In general a Viterbi algorithm, a Reed-Solomon code, etc may be used for correcting the error. In such a case, the reception quality may be detected by using the error correction ratio obtained by either of the Viterbi algorithm and the Reed-Solomon code.

FIGS. 7A, 7B, 8A, 8B and 8C show the reception quality detecting in detail.

In these drawings, the error corrector 21 is comprises of a convolution decoder 22 using the Vitervi algorithm, a de-interleaver 23 for de-interleaving data which is interleaved at a transmitter and a Reed-Solomon decoder 24.

Figure 7A:
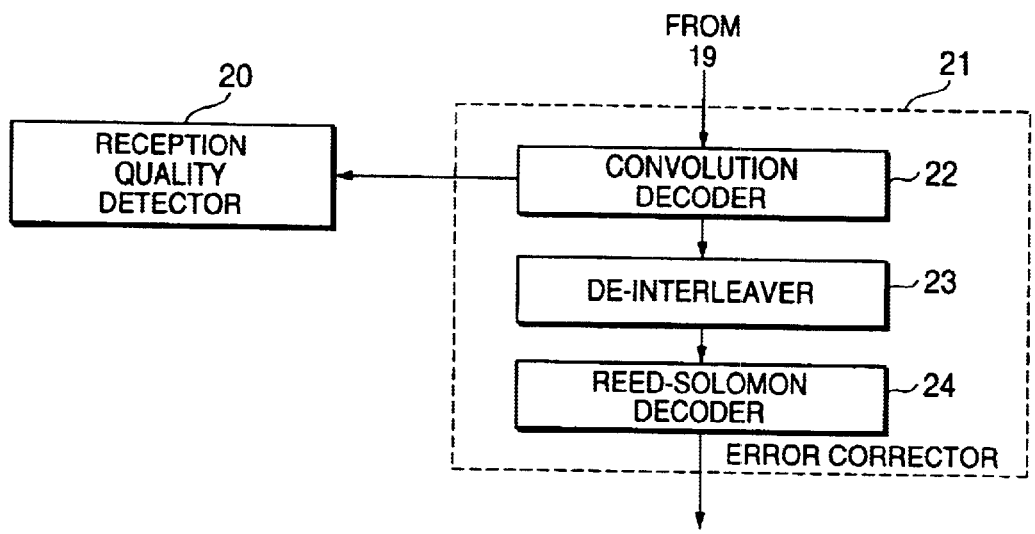
FIGS. 7A and 7B are block diagrams showing a reception quality detecting operation by an error correction ratio for explaining one embodiment of the reception quality detector.
Figure 7B:
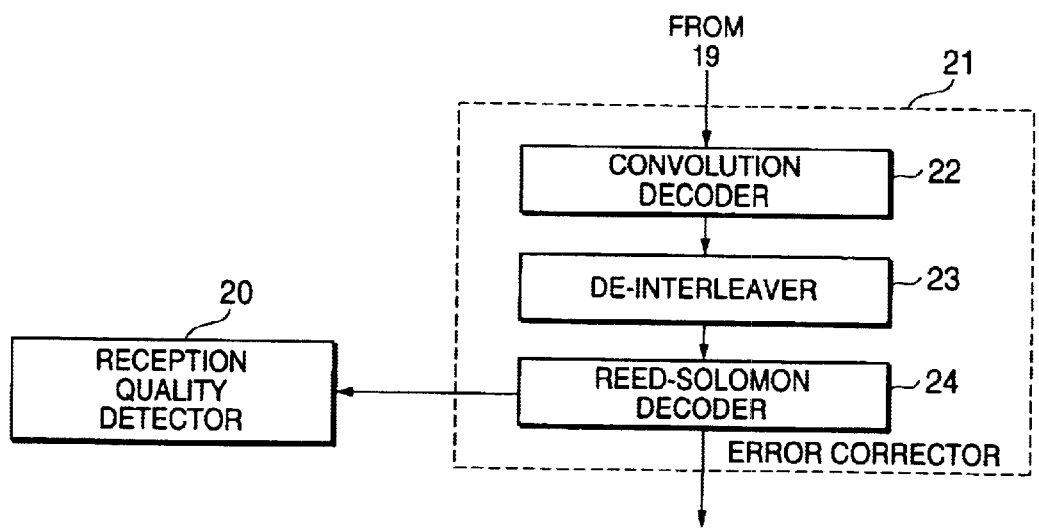

FIG. 7 shows the embodiment that the reception quality detector 20 detects the reception quality by using the error correction ratio. FIG. 7A shows the construction of the reception quality detecting by the error correction ratio in the convolution decoder 22. FIG. 7B shows the construction of the reception quality detecting by the error correction ratio in the Reed-Solomon decoder 24.

Figure 8A:
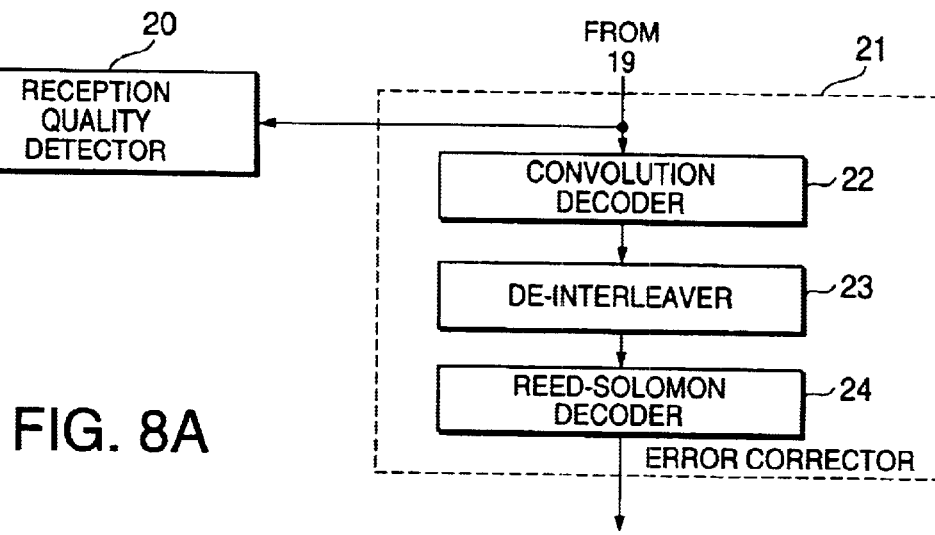
FIGS. 8A to 8C are block diagrams showing the reception quality detecting operation by an error rate for explaining one embodiment of the reception quality detector.
Figure 8B:
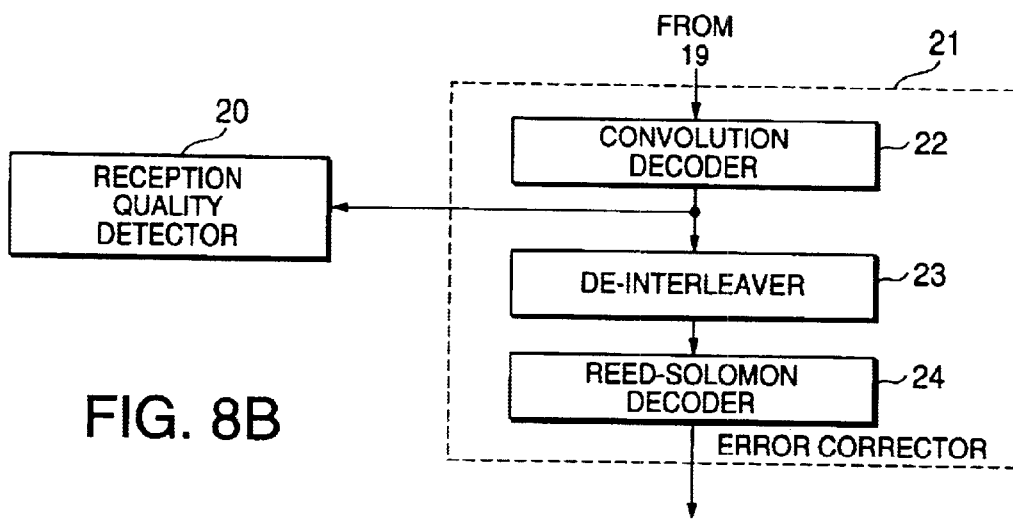
Figure 8C:
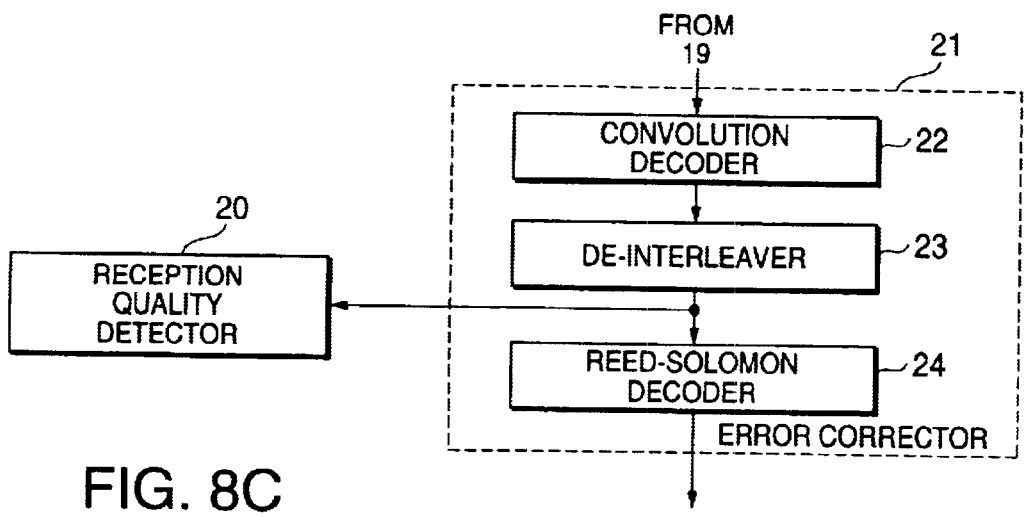

FIGS. 8A to 8C shows the embodiment that the reception quality detector 20 detects the reception quality by using the error rate before and after correcting rate. FIG. 8A shows the construction of the reception quality by the error rate before convolution-decoding data in the convolution decoder 22. FIG. 8B shows the construction of the reception quality detecting by the error rate after convolution-decoding data in the convolution decoder 22. FIG. 8C shows the construction of the reception quality detecting by the error rate before decoding the Red-Solomon code in the Reed-Solomon decoder 24.

As mentioned above, the optimal value of the TOP is varied according to the receiving condition. It is easily estimated that the optimal value of the TOP is not varied much when the receiving point or the receiving channel is fixed. Next, the embodiments, which are available under such a condition, will be explained hereinafter.

The optimal value of the TOP is selected at the first receiving time. And the setup value of the TOP is stored in the memory in the receiver. Then, at the next receiving time the setup value of the TOP that is stored in the memory is used as the initial value, and if it is needed the value is varied to be optimal again. The memory may be defined in the TOP unit 14A, as shown in FIG. 1 or FIG. 6.

In such a construction, it is possible to shorten the time for improving the reception quality after next receiving time.

As shown in FIG. 1, the RF signal is performed the frequency conversion into the IF signal, then performed a quadrature detection in the demodulator 19 to output the IQ base-band signal. However, the present invention is not limited to such a situation, and is applied to the construction that the quadrature detection is performed from the RF signal directly to output the base-band signal.

As described above, even thought there is a difference of the radio frequency efficiency for each receiving channel, or a difference of the receiving radio wave such as a level of the adjacent channel, it is possible to obtain the stable reception quality.

In the fixed receiving or the moving receiving of the ground broadcasting, the receiving conditions differs much by the field-strength, the interference by the analog signal, the multi-pass, or the fading, but it is available in such a case.

What is claimed is:

1. An automatic gain controller for use in a receiver for demodulating a radio frequency signal, comprising:

a circuit located on a passage of the radio frequency signal, which having a non-linear region to an input level of the radio frequency signal which is supplied as an input;

a first variable gain circuit which is placed ahead the circuit with the non-linear region;

a second variable gain circuit placed in following the non-linear region;

a gain controller, which is for controlling the gains of the first and the second variable gain circuits according to the signal level output from the second variable gain control, for controlling to activate the gain control of the second variable gain circuit when the input level of the radio frequency signal to the receiver is lower than a reference level, and controlling to activate the gain control of the first variable gain circuit and also controlling to maintain the gain of the second variable gain circuit to the certain level when the input level is over the reference level;

a reception quality detector for detecting the reception quality which is defined after the second variable gain circuit; and a reference level setting unit for setting up the reference level, which is variable according to the reception quality detected in the reception quality detector, in the gain controller.

2. An automatic gain controller as claimed in claim 1, wherein the reception quality of signals is detected first by a reference level pre-designated in the reference level setting unit, and again detected by another reference level which is varied from the pre-designated reference level in the direction that the reception quality is improved.

3. An automatic gain controller as claimed in claim 1 or 2, wherein the reception quality detector detects the reception quality of signals by using a spread constellation.

4. An automatic gain controller as claimed in claim 1 or 2, wherein the reception quality detector detects the reception quality of signals by using an error correction ratio for the signal.

5. An automatic gain controller as claimed in claim 1 or 2, the reception quality detector detects the reception quality of signals by using an error ratio of signals before or after an error correction of the signals.

6. An automatic gain controller as claimed in any one of claims 1 to 5, further comprising a memory for storing the values of the reference level, and wherein a reference level which is varied to optimally increase the reception quality of signals and thus capable to be used as an initial value of the reference signal in a following reception of signals.

7. A receiver receiver for demodulating a radio frequency modulation signal by tuning a station, comprising:

an input terminal for receiving a radio frequency signal;

a frequency converter for converting the radio frequency signal received at the input terminal into an intermediate frequency signal;

a first variable gain circuit followed by the frequency converter;

a second variable gain circuit placed in following the frequency converter;

a gain controller, which is for controlling the gains of the first and the second variable gain circuits according to the signal level output from the second variable gain control, for controlling to activate the gain control of the second variable gain circuit when the input level of the radio frequency signal to the receiver is lower than a reference level, and controlling to activate the gain control of the first variable gain circuit and also controlling to maintain the gain of the second variable gain circuit to the certain level when the input level is over the reference level;

a reception quality detector for detecting the reception quality which is defined after the second variable gain circuit; and a reference level setting unit for setting up the reference level, which is variable according to the reception quality detected in the reception quality detector, in the gain controller.

8. A receiver as claimed in claim 7, wherein the reception quality of signals is detected first by a reference level pre-designated in the reference level setting unit, and again detected by another reference level which is varied from the pre-designated reference level in the direction that the reception quality is improved.

9. A receiver as claimed in claim 7, wherein the reception quality detector detects the reception quality of signals by using a spread constellation.

10. A receiver as claimed in claim 7, wherein the reception quality detector detects the reception quality of signals by using an error correction ratio for the signal.

11. A receiver as claimed in claim 7, the reception quality detector detects the reception quality of signals by using an error ratio of signals before or after an error correction of the signals.

12. A receiver claimed in claim 7, further comprising a memory for storing the values of the reference level, and wherein a reference level which is varied to optimally increase the reception quality of signals and thus capable to be used as an initial value of the reference signal in a following reception of signals.

* * * * *